United States Patent [19]
Lau

[11] Patent Number: 5,949,231
[45] Date of Patent: Sep. 7, 1999

[54] ALTERNATING CURRENT MEASURING DEVICE

[76] Inventor: Chi-Sang Lau, 4F., No. 67, Sec. 4, Min Sheng E. Rd., Taipei, Taiwan

[21] Appl. No.: 08/736,327

[22] Filed: Oct. 23, 1996

[51] Int. Cl.$^6$ .................................................. G01R 19/00
[52] U.S. Cl. ........................................ 324/127; 324/117 R
[58] Field of Search ............................... 324/117 R, 127, 324/126, 142, 141; 336/212; 323/48, 60, 112

[56] References Cited

U.S. PATENT DOCUMENTS

| | | | |
|---|---|---|---|
| 1,129,231 | 2/1915 | Robinson et al. | 324/127 |
| 3,011,714 | 12/1961 | Wheeler | 324/127 |
| 3,546,565 | 12/1970 | Downing, Jr. et al. | 324/127 |
| 3,881,149 | 4/1975 | Kilo | 324/127 |

*Primary Examiner*—Vinh P. Nguyen
*Attorney, Agent, or Firm*—Raymond Y. Chan; David & Raymond

[57] ABSTRACT

The alternating current sensor has a transformer-like iron core structure, the circuit in which the current to be measured is connected to the primary winding (current input winding), the secondary winding includes two independent units, namely output current winding and exit measuring winding. The conductor for the output current winding is of high stability with low temperature coefficient of resistance. Nearly the entire induced current in the secondary side flows in the output current winding, finally the induced voltage in the measuring winding is detected by the voltage meter. By this scheme those disadvantages of the conventional alternating current sensor such as high temperature rise, resistance variation caused by increased temperature coefficient of the conductor and the load resistance effect are minimized to achieve the aim of high accuracy alternating current measurement.

3 Claims, 7 Drawing Sheets

ALTERNATING CURRENT MEASURING DEVICE

BACKGROUND OF THE INVENTION

1. Field of the Invention

The present invention relates to a structure of an alternating current sensor comprising a transformer with two units of secondary winding for measuring the values of alternating current with high accuracy.

2. Description of the Prior Art

Current measurement is an essential work in many electricity applications such as instrument and power system. For example, in the field of electrical power system, the stage of the currents flowing in the systems should be measured from time to time in order to supervise the state of all the equipment connected with the systems and assure their normal operation, therefore any malfunction of the equipment can be counteracted by appropriate protecting means. In the field of the integrated circuit, there are numerous control and data signals being transmitted among the electronic components, if only one of those current signals is erroneously detected, it may result in a catastrophic break down of the entire system. Therefore, if the current in those application can be sensed accurately and reliably, the performance of those application can be substantially improved.

Conventional alternating current sensor can be divided into two categories, one of them is called resistance detecting method. Referring to the circuit in FIG. 1, a sense resistor is connected in series with the circuit whose current is to be measured. After reading the voltage value across the sense resistor, the current to be measured on the circuit can be determined according to Ohm Law with the formula $I_{in}=V_{out}/R$. Although the construction of the instrument is simple, yet the variation of the sense resistance value caused by the thermal effect ($P=I_{in}^2 R$) resulted from the current flowing thereon may deteriorate the measurement, especially in the case of large current measurement. Besides, the power consumed by the sense resistor has a influence on the performance of the circuit under measurement.

Another measuring method is by using a current transformer. Referring to the circuit shown in FIG. 2, a kind of instrument transformer usually called a current transformer is employed. The current transformer consists of a primary winding (input current winding) which is connected in series with the circuit to be measured, and a secondary winding (output current winding) which delivers the output current ($I_{out}$) proportional to the input current ($I_{in}$) with a proportional factor equal to the turn ratio of the two windings. That is, $I_{in}=I_{out}\times(M/N)$, where M and N represent the number of turns of the secondary winding and primary winding respectively. After the current $I_{out}$ is measured, the current to be measured can be calculated according to above formula. However, voltage is a quantity easier to deal with than current in measurement aspect, it is a general practice to connect a sense resistor R as a load to the secondary winding to measure the value of voltage $V_{out}$ across the sense resistor. Further, referring to the circuit shown in FIG. 3, the value of the current to be measured $I_{in}$ can be calculated with the formula $I_{in}=(V_{out}/R)\times(M/N)$.

In the above described current measuring method by current transformer, the current to be measured is scaled to a smaller value through a current transformer with suitable turn ratio. With a smaller current flowing in the sense resistor, the power consumption and the thermal effect will be smaller than that of the above mentioned resistance method. Therefore the variation of the value of resistance due to thermal effect will be decreased, and the measuring will be more accurate. However this method still has the following serious problems:

1. There is still necessary to connect a sense resistor to the output winding, and it is inevitable to cause the temperature rise which in turn entails the variation of the resistance value. Such a phenomenon is of great disadvantage to the measurement requiring high degree of accuracy.
2. Due to the fact that the current transformer has its inherent impedance (winding resistance, equivalent core resistance, leakage reactance caused by magnetic leakage fluxes of the windings and magnetizing reactance of the windings), it will produce a voltage drop when current passes it through. Therefore, the value of current converted from output voltage Vout still deviates form its accurate value.
3. Referring to the equivalent circuit shown in FIG. 4, the winding resistance R2 of the secondary winding M generally has a large temperature coefficient of resistance. Therefore, no matter how excellent the quality of the sense resistance R is, the measuring accuracy will be deteriorated by the winding resistance R2 connected in series with it.
4. The winding conductor is in general made of copper material and forms a heterojunction with the sense resistor R, this heterojunction will produce potential work function which interferes the result of measurement. Furthermore, a contact resistance R produced at the junction is also of great temperature dependence, which also deteriorates the measurement.
5. In case the current to be measured is very large, the current ratio, and accordingly the turn ratio of the two windings of the current transformer used for the measurement will also be very large. This causes the difficulty in manufacturing and a narrowing in bandwidth. For one of the solutions, several units of current transformers connected in cascade for scaling down the values of current step by step may be feasible. Referring to the circuit shown in FIG. 5, the voltage $V_{out}$ is obtained from the secondary winding of the last current transformer by the sense resistor R connected to it, and the current to be measured can be determined by the output voltage and the product of every turn ratio. However, in the above cascade scheme, those undesired effects, such as winding resistance, contact resistance and the thermal effect will also be magnified even thought the current is scaled down.

SUMMARY OF THE INVENTION

As will be clear by the above description, conventional alternating current sensors have the deficiencies which are unable to overcome up to now, consequently accurate (e.g. ppm level) and reliable measurement of alternating current can not be realized by a conventional sensor.

The object of the present invention is to provide an alternating current sensor that can overcome above problems and measure current accurately.

To achieve the above object, the alternating current sensor according to the present invention has a transformer-like iron core structure, and comprises a primary winding (input current winding) which is connected in series with the circuit to be measured and a set of two secondary windings, each of them realizes the roles of provision of the sense resistor and measurement of the output voltage, respectively. More specifically, the secondary winding set comprises a first set of secondary winding (output current winding) which is made of materials with low temperature coefficient of resistance and high stability (e.g. copper-manganese wire), and has its both ends short by soldering them together to form a resistor with high thermal stability and low resistance, and a second set of secondary winding (measuring winding) which is open circuited for measuring the voltage across it. The advantages of the sensor according to the present invention over the conventional ones are as follows:

1. According to the present invention, the measuring winding for picking up the output voltage is in the state of open circuit, and accordingly it conduct nearly no current. Effectively, the output current winding, made of material with small temperature coefficient of resistance, can serve as the load resistance at the secondary winding side. Therefore, the disadvantages caused by thermal effect can be minimized. In addition, the output current winding connects to no sense resistor, therefore the material is homogeneous all over and no heterojunction work function and contact resistance are formed.

2. The voltage induced in the output current winding can be related to that induced in the measuring winding by their turn ratio. Accordingly, the induced voltage of the output current winding can be determined from the voltage picked up at the measuring winding. Because the measuring winding will be connected to a voltage meter with a very large input impedance, there is few amount of current flowing through the measuring winding. The voltage drop caused by the impedance of the iron core and the winding can be neglected, accordingly the loading effect occurred in the conventional transformer can be minimized.

3. The output current winding exhausts nearly the total power consumption for it conducts almost the entire current flowing in the secondary winding side. Because the output current winding does not employ a sense resistor and accordingly has a much smaller resistance value, its power consumption is far smaller compared to that produces in the conventional resistance method or current transformer method.

4. In case the current to be measured is very large, the current flowing in the secondary winding will also be very large if the turn ratio of primary winding to secondary winding does not increase. As to a conventional current transformer which does not utilize the cascade scheme, the sense resistor is unable to withstand such a large amount of heating power generated and may burn up, or assuming the sense resistor is able to withstand such a large heating power, the voltage drop on the resistance will be so large that it is not only difficult to measure but also is dangerous. On the contrary, for the sensor of the present invention, the resistance of the output current winding is very small for it does not connect to a sense resistor, and its thermal power generated and voltage drop induced on the winding are much smaller than those of a conventional device. Even though the voltage induced in the output current winding is extremely high due to a very large current to be measured, the voltage can be read from the measuring winding, and this induced voltage can be decreased by changing the turn ratio of the two set of secondary windings. Besides, the voltage induced in the measuring winding can be decreased by decreasing the resistance of the output current winding, for example, increasing the cross section of the winding conductor used. Therefore, the application of cascade connection of the current transformers is not necessary in case of using the device of the invention to measure large current, the only recommended procedure is to change the turn ratio of the two secondary windings or the value of resistance of the output current winding. The alternating current sensor of the present invention has the advantages of versatility, cost effectiveness and compactness.

The principle purpose of the present invention is to present the customer an innovative alternating current sensor with high accuracy and low power loss wherein the secondary winding of its current transformer is divided into two units to minimize the measuring inaccuracy through diminishing temperature rise, reducing the temperature coefficient of the conductor resistance and excluding the effect caused by the sense resistor.

BRIEF DESCRIPTION OF THE DRAWINGS

The present invention, as well as its many advantages, may be further understood by the following detailed description and drawings in which.

ILLUSTRATION OF THE SYMBOLS

I: current to be measured
$I_{in}$: input current
$I_{out}$: output current
R: sense resistor
R1: resistance of input current winding
R2: resistance of output current winding
Rc: contact resistance
r1: resistance of input current winding according to the invention
r2: resistance of output current winding according to the invention
r3: resistance of measuring winding according to the invention
r4: internal resistance of the voltage meter
$V_{out}$: voltage to be measured
N: number of turns for input current winding
M: number of turns for output current winding
P: number of turns for measuring winding
: interfering potential work function
N1: number of turns for the first cascaded current transformer input current winding
N2: number of turns for the second cascaded current transformer input current winding
Nn: number of turns for the nth cascaded current transformer input current winding
M1: number of turns for the first cascaded current transformer output current winding
M2: number of turns for the second cascaded current transformer output current winding
Mn: number of turns for the nth cascaded current transformer output current winding

DETAILED DESCRIPTION OF THE PREFERRED EMBODIMENT

Figure 1:
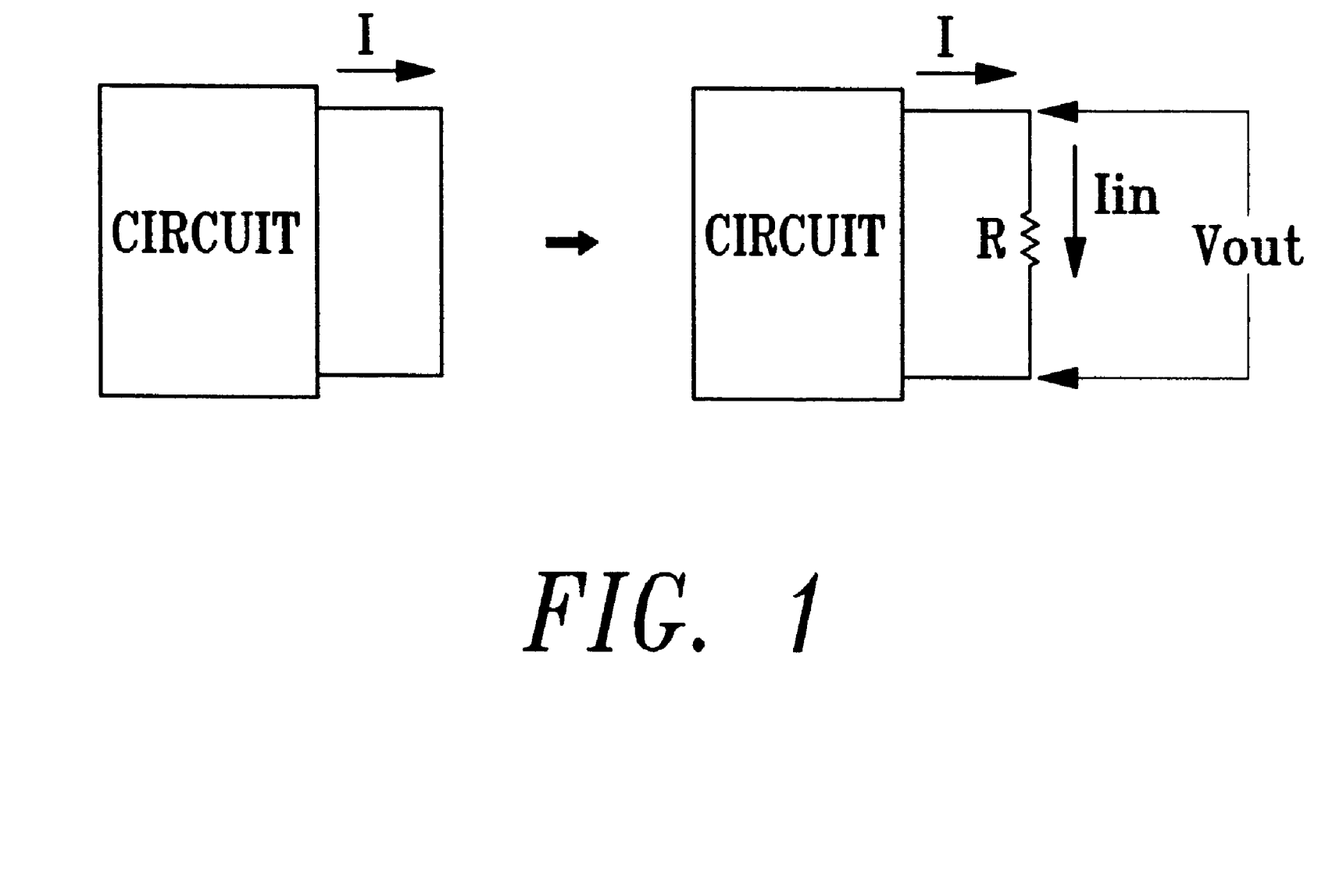
FIG. 1 is a circuit diagram for measuring current with conventional resistance method.

Referring to FIG. 1 showing the circuit for measuring current with the resistance method, after measuring the value of voltage $V_{out}$ on the sense resistor R, the value of current to be measured $I_{in}$ can be calculated by applying Ohm Law.

Figure 2:
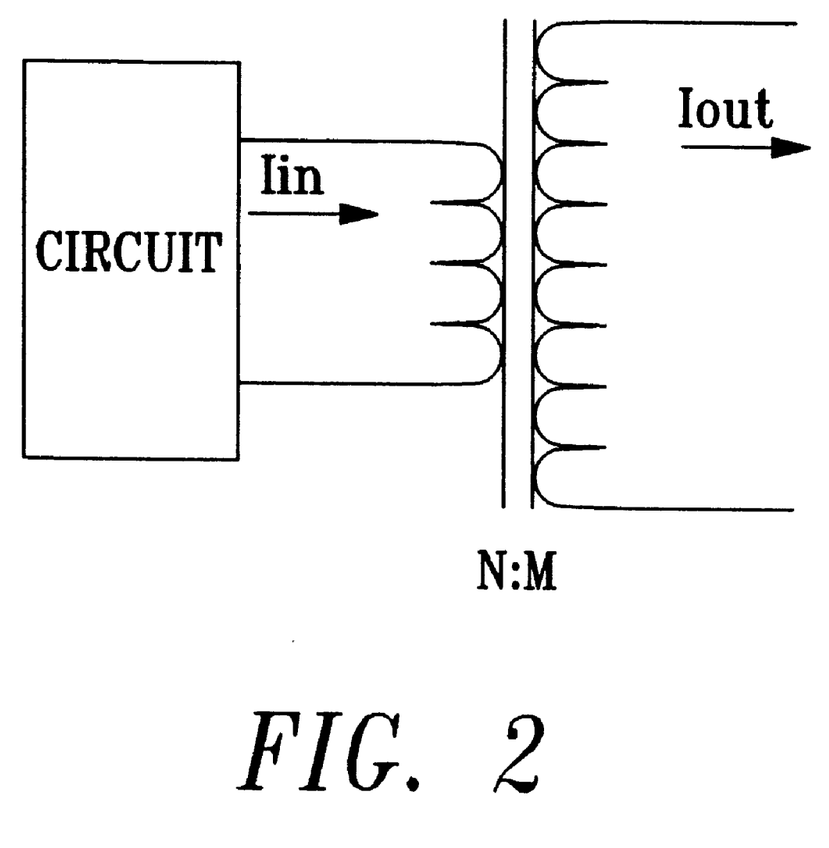
FIG. 2 is a circuit diagram for measuring current with conventional current transformer method.

Referring FIG. 2 showing the circuit for measuring current with the current transformer method, after measuring the value of current $I_{out}$ in the secondary winding, the value of current to be measured $I_{in}$ may be obtained with reference to the turn ratio of input and output current winding.

Figure 3:
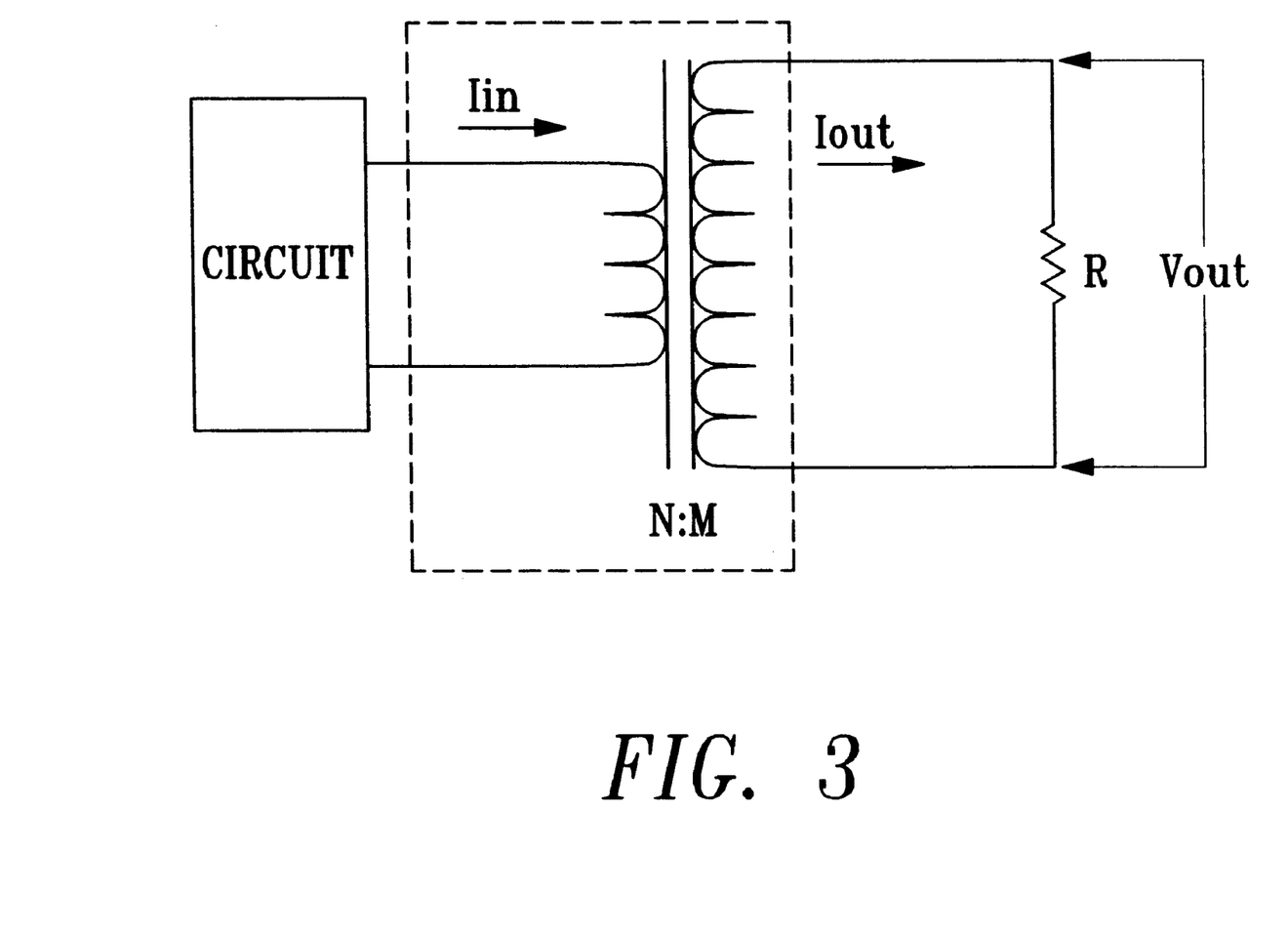
FIG. 3 is a circuit diagram showing a conventional current measuring method by measuring the voltage on the sense resistance connected in the secondary side of a current transformer.

Referring to FIG. 3 showing a circuit diagram for measuring current by measuring the voltage on the sense resistor connected in the secondary side of a current transformer, within the dotted line is a current transformer. After the value of voltage $V_{out}$ on the resistance R has been measured, the current to be measured can be calculated by the formula $$I_{in}=(V_{out}/R)\times(M/N)$$

Figure 4:
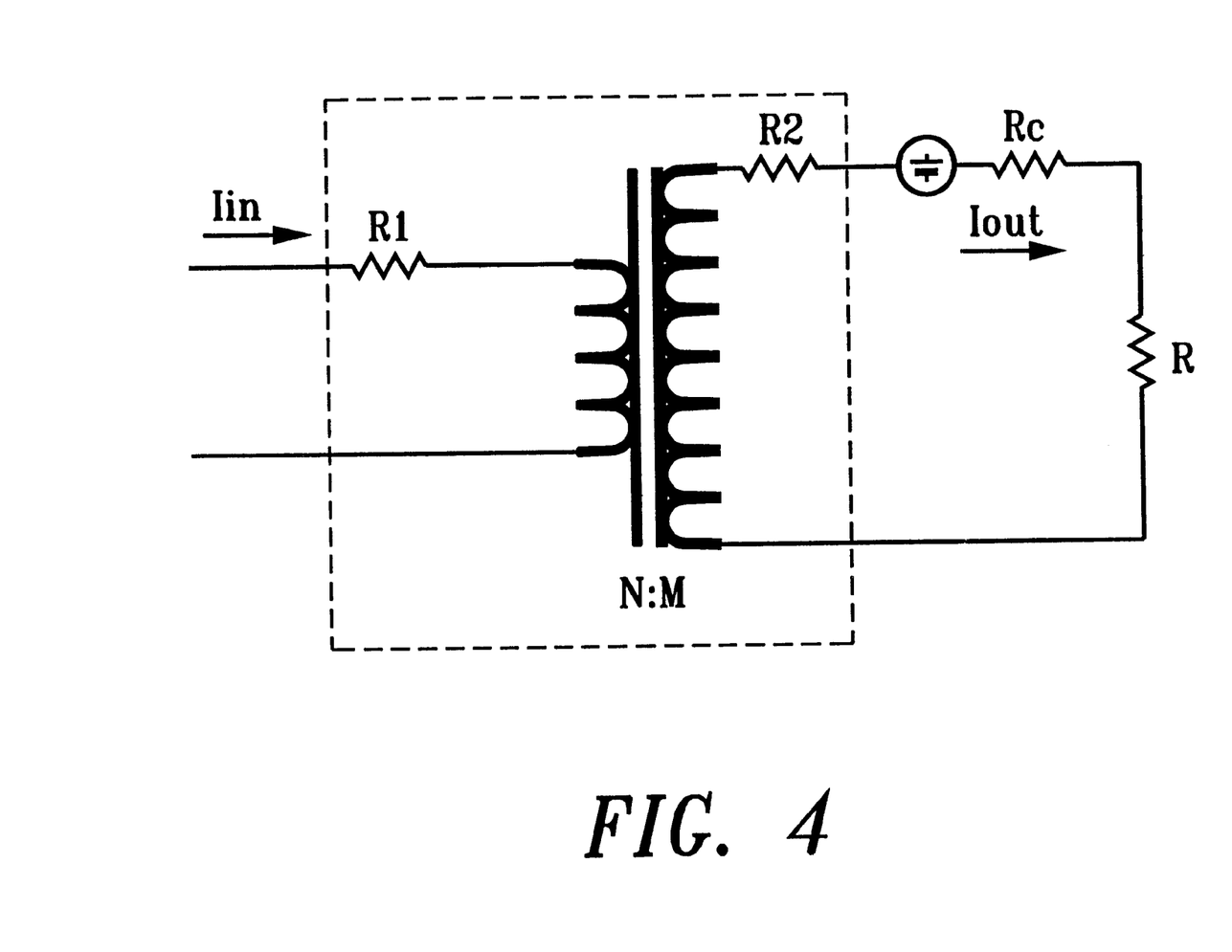
FIG. 4 is an equivalent circuit diagram of FIG. 3.

Referring to FIG. 4 showing an equivalent circuit of FIG. 3, the equivalent circuit for a actual current transformer is surrounded by dotted lines, and an ideal transformer is drawn with highlighted solid line. The transformer itself has impedance including winding resistance, equivalent core resistance, leakage reactance caused by leakage magnetic fluxes of windings and magnetizing reactance of windings etc. Among those impedance, the winding resistance is the most influential one which may be of great affect to the transformer. Consequently the equivalent circuit for an actual current transformer comprises an ideal transformer with the resistance R1 and R2 of the both windings. Besides an interfering potential work function and a contact resistance Rc can not be neglected because a sense resistor which forms a heterojunction with winding conductor is to be connected on the secondary side.

Figure 5:
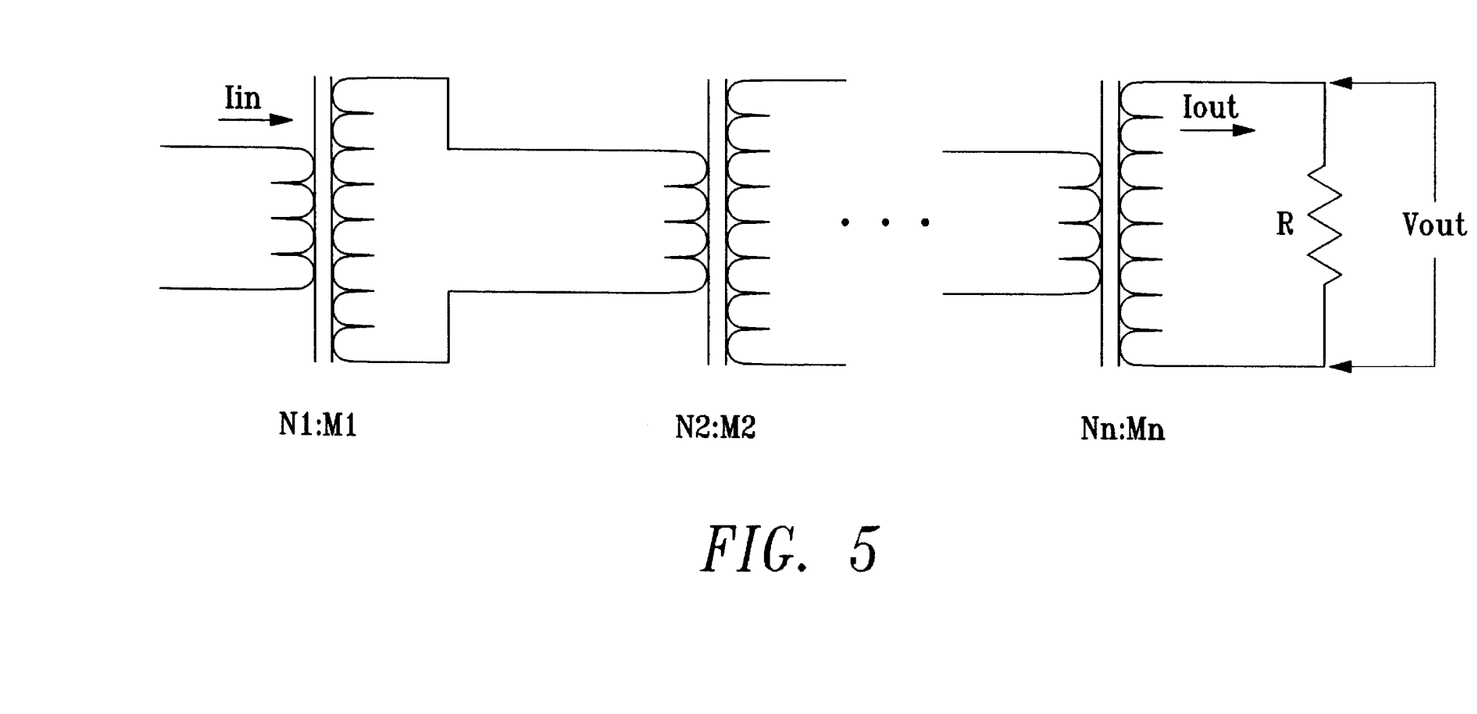
FIG. 5 is a circuit diagram showing a conventional method by connecting several current transformers in cascade for measuring large current.

Referring to FIG. 5 showing a circuit connecting several current transformers in cascade for the purpose of measuring large current, several units of current transformer connected in this way may scale down the current gradually, and a resistance is connected on the secondary side of the last transformer to take out the output voltage $V_{out}$, and the current to be measured can be calculated with the formula $$I_{in}=(V_{out}/R)\times(M1/N1)\times(M2/N2)\times\ldots\times(Mn/Nn).$$

Figure 6:
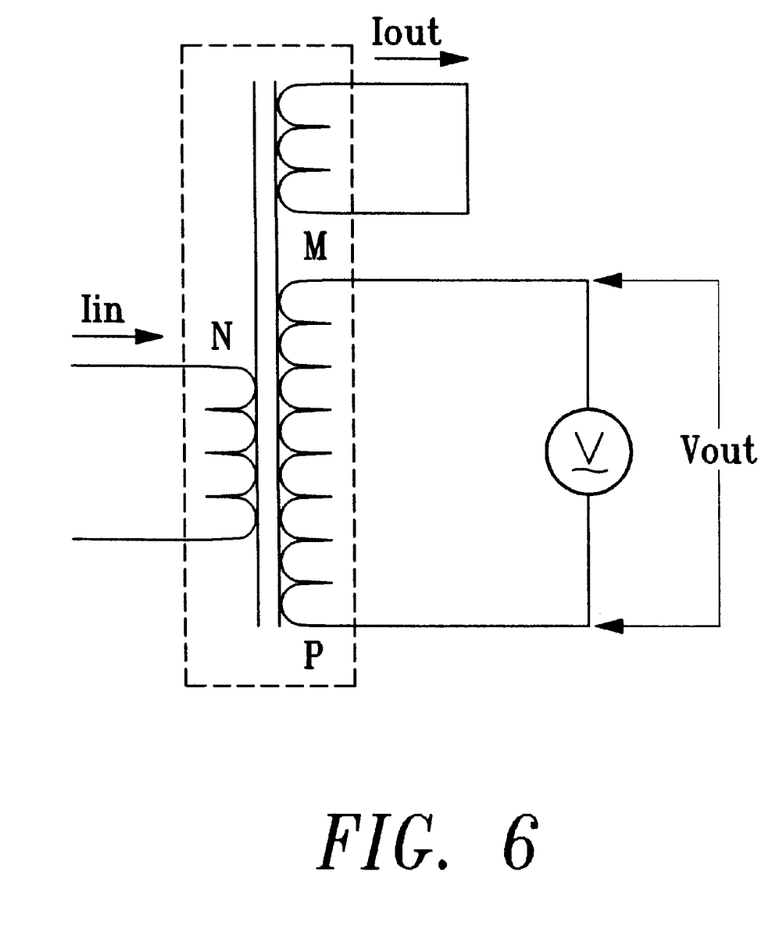
FIG. 6 is a circuit diagram for the alternating current sensor according to the present invention.
Figure 7:
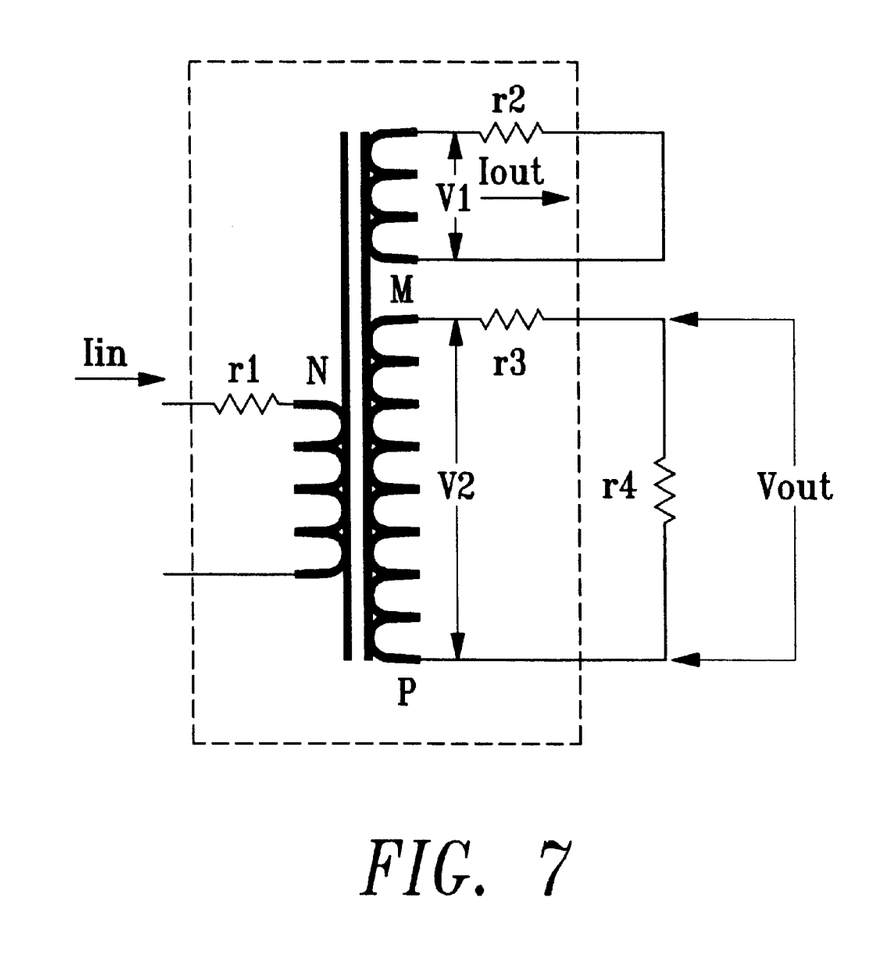
FIG. 7 is an equivalent circuit diagram for the alternating current sensor according to the invention.

Referring to FIG. 6 showing a circuit for the alternating current sensor according to the present invention, the device comprises a transformer-like core structure and its primary winding which is connected in series with the circuit to be tested has N turns. Similar to a conventional current transformer, the iron core can also form a aperture, said alternating current circuit to be measured may be inserted through the aperture for measuring the current flowing thereon. The secondary winding is divided in two units, wherein the first secondary winding (output current winding) has M turns of winding and use the conductor of low resistance temperature coefficient such as copper- manganese wire with high stability, both ends of the winding are short circuited by soldering them together. While the winding of the second secondary winding (measuring winding) may use common copper conductor having P turns with its both ends open circuited for voltage measurement. The input resistance of the voltage meter is in general very high, therefore the current flowing in the measuring winding is very small. The measuring winding is still in the state of open circuit even after the voltage meter has been connected thereto. The secondary current of the transformer may be considered to flow almost completely in output current winding in the aspect that the current flowing in the secondary winding should counteracts completely the magneto motive force of the primary winding current. However, the measuring winding carrying negligibly small current is used for the voltage read out. The prominent feature of the device is characterized in that by utilizing the two secondary windings to perform their different duties described above, the deficiencies of the conventional current transformer such as high temperature rise caused by power loss, increased conductor resistance in the alternating current sensor and load resistance effect resulting in the measurement error can be diminished substantially to attain the aim of high accuracy measurement. Further to described the principle of the present invention in more detail and derive its result with formulas in practical application, the equivalent circuit of the present invention can be analyzed as follows:

FIG. 7 is an equivalent circuit diagram for the alternating current sensor according to the present invention, said sensor can be represented by an equivalent ideal transformer (highlighted solid line in FIG. 7) plus the winding resistance r1, r2 and r3 at both sides, and r4 is the input resistance of the voltage meter. By applying the formula for the ideal transformer, the value of current in the input current winding will be $I_{out}=I_{in}\times(N/M)$, where numbers of turns N and M are known values. Since the both ends of the output current winding having the resistance r2 are short circuited, thus the voltage V1 is equal to $I_{out}\times r2$ and is a thermally stable quantity for r2 is a resistor with high thermal stability. The voltage V1 is not easy to deal with but it can be related to the voltage measured in the measuring winding through the formula $V2=V1\times(P/M)=I_{in}\times(N/M)\times r2\times(P/M)$. Since the input resistance of the voltage meter r4 is very high (more than 1MΩ), the measuring winding may be considered as open circuited with almost no current flowing in it, and almost no voltage drop is produced in it. Moreover, the resistance of the output current winding is only several ohms, the load resistant effect usually observed in the conventional current transformer does not occur in the device of the present invention. The voltage $V_{out}$ measured by the voltage meter is equal to V2 which is related to current to be measured $I_{in}$ by $I_{in}=V2\times M^2/N/P/r2$. The sample of device according to the invention has been testified in the laboratory of China National Measurement Laboratory, and the theoretical analysis described above is in well agreement with the experimental results.

In conclusion, the alternating current sensor of the present invention has realized its aim of measuring alternating current with extremely high accuracy which the conventional measuring instrument can not attain, the currents to be measured can be adjusted in wide range by changing the turn ratio of windings.

Many changes and modifications in the above described embodiment of the invention can, of course, be carried out without departing from the scope thereof According, to progress in science and the useful arts, the invention is disclosed and is intended to be limited only by the scope of the appended claims.

What is claimed is:

1. An alternating current measuring device, comprising:
   a transformer-like iron core made of high permeability material with low core loss, low hysteresis loss, low leakage fluxes and low exciting reactance;
   an input current winding having a first predetermined turns of conductor winding around said iron core, wherein said input current winding is connected in series with an alternating current circuit to be measured; and a secondary winding comprising an output current winding and a measuring winding, wherein said output current winding having at least one turn of conductor winding around said iron core and two ends connected together and short circuited, wherein said output current winding which has a closed contour is made of homogeneous material with low resistance temperature coefficient and high stability; and said measuring winding having a third predetermined turns of conductor winding around said iron core and two ends open circuited for connecting to a voltage meter for measuring an induced voltage thereon;

wherein an input resistance of said voltage meter is high while a current flowing in said measuring winding is small, moreover said measuring winding remains in open circuited even after said voltage meter is connected thereto, and that said alternating current circuit to be measured is connected to said input current winding, a secondary current almost entirely flowing in said output current winding in such a manner that said secondary current flowing in said secondary winding counteracts completely a magneto motive force of said input current winding while said measuring winding carrying negligibly small current, therefore a voltage induced by said secondary current is measured with said voltage meter.

2. An alternating current measuring device, as recited in claim 1, further comprising a first winding resistance connected to said input current winding, a second winding resistance connected to said output current winding, a third winding resistance connected to said measuring winding, and a fourth winding resistance acting as an input resistance of said voltage meter.

3. An alternating current measuring device, as recited in claim 2, wherein said homogeneous material with low resistance temperature coefficient and high stability is copper-manganese wire.

* * * * *